(12) United States Patent
Liu et al.

(10) Patent No.: US 8,331,178 B2
(45) Date of Patent: Dec. 11, 2012

(54) MEMORY DEVICE CAPABLE OF OPERATION IN A BURN IN STRESS MODE, METHOD FOR PERFORMING BURN IN STRESS ON A MEMORY DEVICE, AND METHOD FOR DETECTING LEAKAGE CURRENT OF A MEMORY DEVICE

(75) Inventors: Shi-Huei Liu, Hsinchu County (TW); Tzu-Hao Chen, Kaohsiung (TW); Te-Yi Yu, New Taipei (TW); Ming-Hong Kuo, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/303,172

(22) Filed: Nov. 23, 2011

(65) Prior Publication Data

US 2012/0163107 A1 Jun. 28, 2012

(30) Foreign Application Priority Data

Dec. 24, 2010 (TW) .............................. 99145750 A

(51) Int. Cl.
*G11C 29/00* (2006.01)

(52) U.S. Cl. ....................................................... 365/201
(58) Field of Classification Search ........................ None
See application file for complete search history.

(56) References Cited

U.S. PATENT DOCUMENTS 6,067,261 A * 5/2000 Vogelsang et al. ............ 365/201

* cited by examiner

*Primary Examiner* — Huan Hoang
*Assistant Examiner* — James G Norman
(74) *Attorney, Agent, or Firm* — Winston Hsu; Scott Margo

(57) ABSTRACT

Activate one active word line of two active word lines formed between two isolation word lines to a logic-high voltage, and float another active word line of the two active word lines. Then activate a plurality of first memory cells corresponding to the active word line having the logic-high voltage to a logic "1" voltage, and write a logic "0" voltage to a plurality of second memory cells corresponding to the floating active word line. Then write the logic "1" voltage to a plurality of bit lines. Then, suspend for charge sharing for a third predetermined time. Finally, read a voltage of the floating active word line to check if any leakage path exists between the floating active word line and the active word line having the logic-high voltage.

18 Claims, 13 Drawing Sheets

Memory cell

MEMORY DEVICE CAPABLE OF OPERATION IN A BURN IN STRESS MODE, METHOD FOR PERFORMING BURN IN STRESS ON A MEMORY DEVICE, AND METHOD FOR DETECTING LEAKAGE CURRENT OF A MEMORY DEVICE

BACKGROUND OF THE INVENTION

1. Field of the Invention

The present invention is related to a memory device capable of operation in a burn in stress mode, a method for performing the burn in stress mode on the memory device, and a method for detecting leakage current of the memory device, and particularly to a memory device capable of operation in a burn in stress mode, a method for performing the burn in stress mode on the memory device, and a method for detecting leakage current of the memory device that can utilize an isolation word line design and the burn in stress mode to detect any leakage current path corresponding to a plurality of word lines of the memory device.

2. Description of the Prior Art

In a dynamic random access memory (DRAM), any leakage current path corresponding to a plurality of word lines is usually a main memory defect. Any leakage current path can be formed by a short between the plurality of word lines, and/or contamination particles of a memory process. Because some leakage current paths are very weak, leakage currents of some weak leakage current paths may also be very weak. But, the prior art does not strengthen the weak leakage current paths before the test is performed on the dynamic random access memory, so the prior art can not detect all leakage current paths corresponding to a plurality of word lines of the dynamic random access memory. Therefore, it is difficult to determine all leakage current paths for the prior art dynamic random access memory.

SUMMARY OF THE INVENTION

An embodiment provides a memory device capable of operation in a burn in stress mode. The memory device includes M isolation word lines, a plurality of active word lines, a plurality of bit lines, M first switches, and M second switches. Each first switch of the M first switches has a first terminal for receiving a low voltage, a second terminal for receiving a first control voltage, and a third terminal coupled to an isolation word line. A (4n+1)th second switch of the M second switches has a first terminal for receiving a first stress voltage, a second terminal for receiving a second control voltage, and a third terminal coupled to a (4n+1)th isolation word line; a (4n+2)th second switch has a first terminal for receiving a second stress voltage, a second terminal for receiving the second control voltage, and a third terminal coupled to a (4n+2)th isolation word line; a (4n+3)th second switch has a first terminal for receiving the first stress voltage, a second terminal for receiving the second control voltage, and a third terminal coupled to a (4n+3)th isolation word line; a (4n+4)th second switch has a first terminal for receiving the second stress voltage, a second terminal for receiving the second control voltage, and a third terminal coupled to a (4n+4)th isolation word line, where M is a positive integer multiple of 4, is a positive integer or zero, $4n \leq M-4$, and two active word lines formed between each two consecutive isolation word lines, where the two active word lines and the plurality of bit lines are used for controlling a plurality of memory cells.

Another embodiment provides a method for performing a burn in stress mode on a memory device. The method includes turning off M first switches; turning on M second switches for a (4n+1)th isolation word line and a (4n+3)th isolation word line to receive a first stress voltage, and a (4n+2)th isolation word line and a (4n+4)th isolation word line to receive a second stress voltage, where the first stress voltage is different from the second stress voltage; programming voltages of a plurality of active word lines.

Another embodiment provides a method for detecting leakage current of a memory device. The method includes turning off M first switches and M second switches; activating a plurality of active word lines and a plurality of memory cells of the memory device to a logic-high voltage; suspending for charge sharing for a first predetermined time; turning on a voltage sensing circuit to determine whether at least one leakage current path exists between the plurality of active word lines and M isolation word lines.

Another embodiment provides a method for detecting leakage current of a memory device. The method includes activating a plurality of memory cells to a logic "1" voltage and floating a plurality of active word lines; entering a burn in stress mode to maintain M isolation word lines at a logic-high voltage; suspending for charge sharing for a second predetermined time; turning off the M isolation word lines and the plurality of active word lines and pre-charging the plurality of bit lines; activating the plurality of active word lines again; reading voltages of the plurality of memory cells to determine whether at least one leakage current path exists between the plurality of active word lines and the M isolation word lines.

Another embodiment provides a method for detecting leakage current of a memory device. The method includes activating one active word line of two active word lines formed between two isolation word lines to a logic-high voltage, and floating another active word line of the two active word lines; activating a plurality of first memory cells corresponding to the active word line having the logic-high voltage to a logic "1" voltage, and writing a logic "0" voltage to a plurality of second memory cells corresponding to the floating active word line; writing the logic "1" voltage to a plurality of bit lines; suspending for charge sharing for a third predetermined time; reading voltages of the floating active word line to determine whether at least one leakage current path exists between the floating active word line and the active word line having the logic-high voltage.

The present invention provides a memory device capable of operation in a burn in stress mode, a method or performing the burn in stress mode on the memory device, and a method for detecting leakage current of the memory device. The memory device and the methods first let the memory device enter the burn in stress mode for strengthening any original weak leakage current path. Then, the memory device including a plurality of isolation word lines can be used for detecting any leakage current path from a plurality of active word lines to the plurality of isolation word lines, any leakage current path from the plurality of isolation word lines to the plurality of active word lines, and any leakage current path between two adjacent active word lines. Therefore, compared to the prior art, the present invention can detect all leakage current paths corresponding to a plurality of active word lines of the memory device by an isolation word line design and the burn in stress mode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
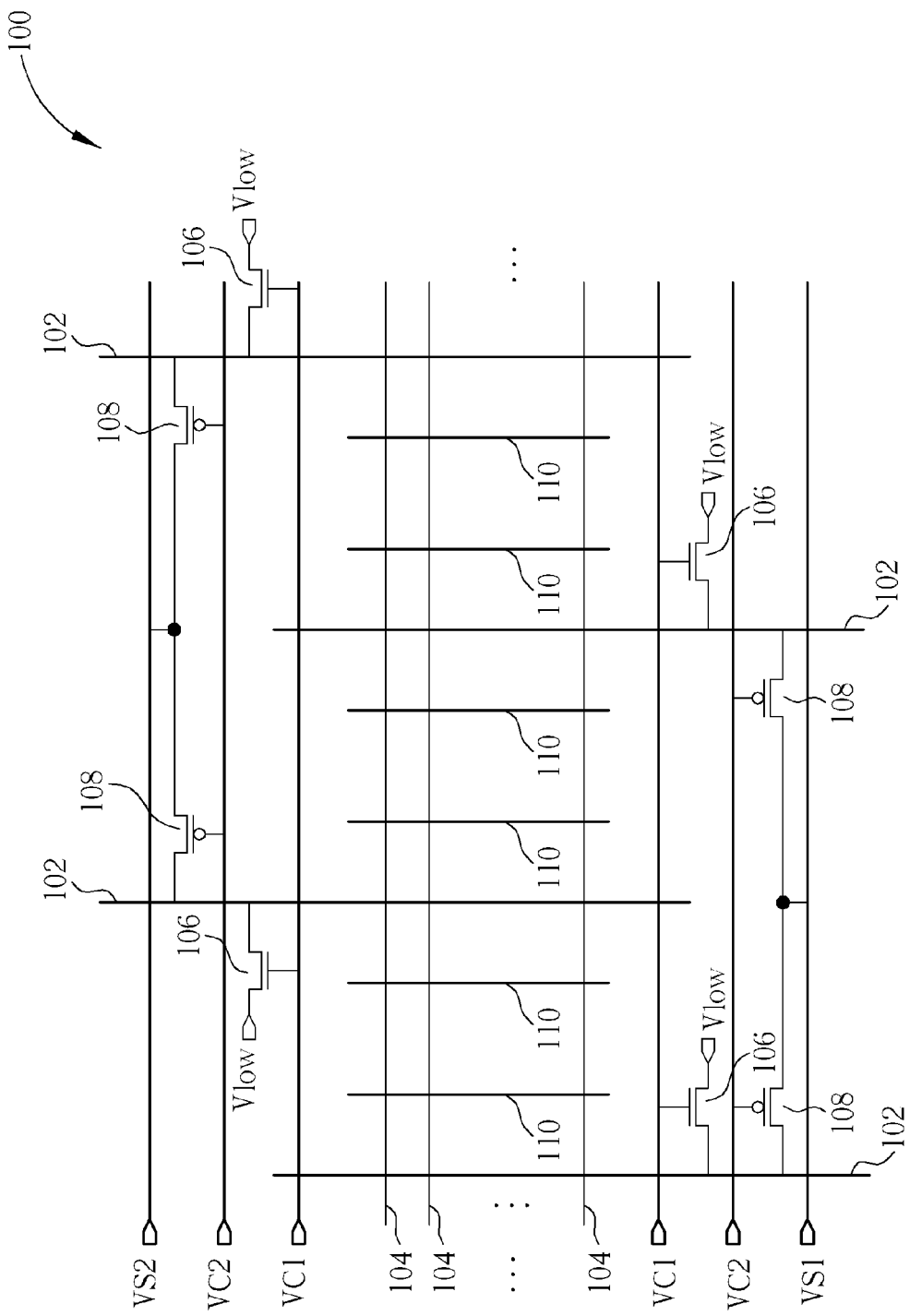
FIG. 1 is a diagram illustrating a memory device capable of operation in a burn in stress mode according to an embodiment.
Figure 2:
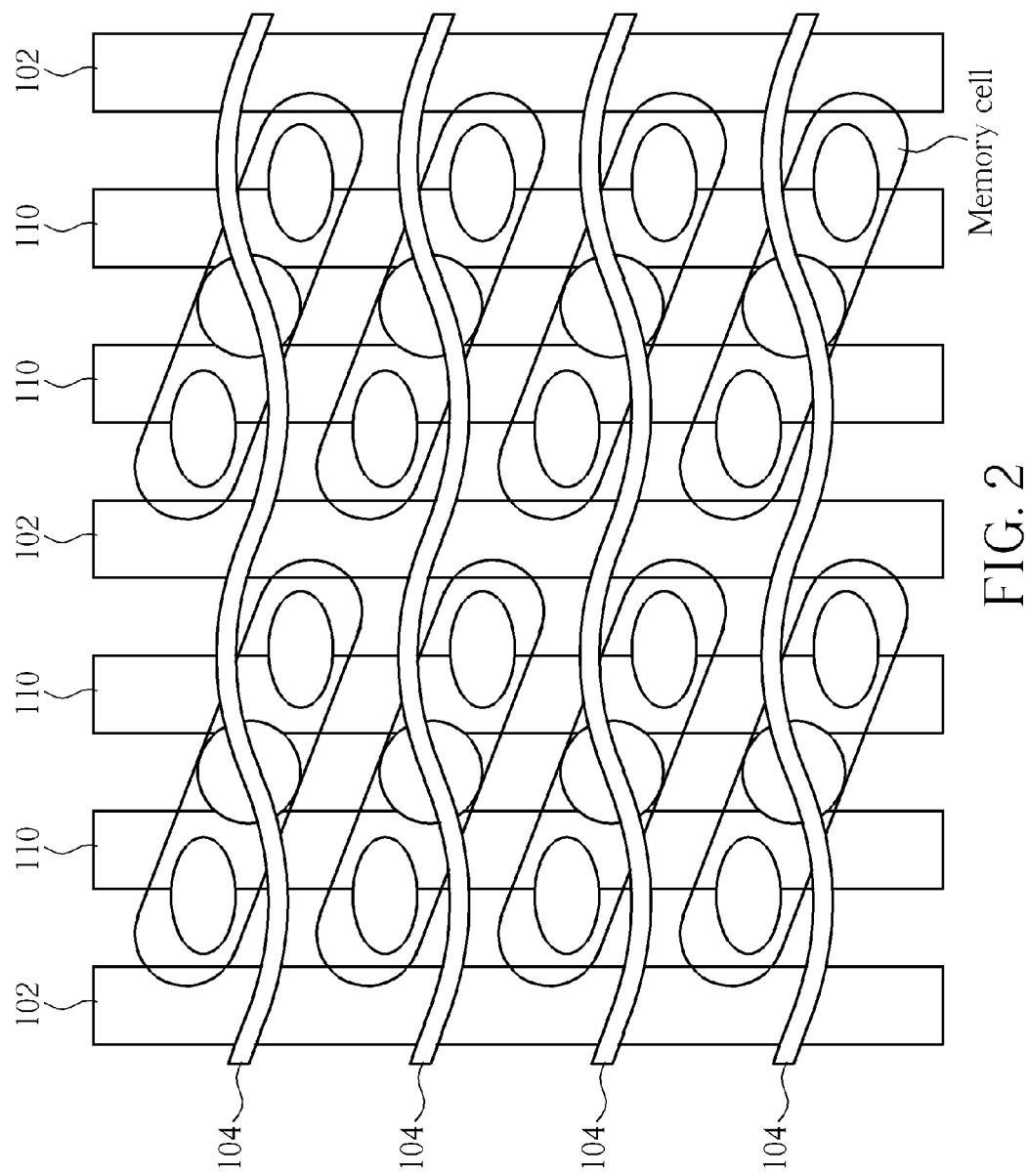
FIG. 2 is a diagram illustrating a layout of the memory device.

Please refer to FIG. 1 and FIG. 2. FIG. 1 is a diagram illustrating a memory device 100 capable of operation in a burn in stress mode according to an embodiment, and FIG. 2 is a diagram illustrating a layout of the memory device 100. The memory device 100 includes M isolation word lines 102, a plurality of bit lines 104, M first switches 106, M second switches 108, and a plurality of active word lines 110, where M is a positive integer multiple of 4. The first switch 106 has a first terminal for receiving a low voltage Vlow, a second terminal for receiving a first control voltage VC1, and a third terminal coupled to an isolation word line 102. In FIG. 1, the first switches 106 are N-type metal-oxide-semiconductor transistors. But, the first switches 106 can also be P-type metal-oxide-semiconductor transistors. In the M second switches 108, a (4n+1)th second switch 108 has a first terminal for receiving a first stress voltage VS1, a second terminal for receiving a second control voltage VC2, and a third terminal coupled to a (4n+1)th isolation word line 102; a (4n+2)th second switch 108 has a first terminal for receiving a second stress voltage VS2, a second terminal for receiving the second control voltage VC2, and a third terminal coupled to a (4n+2)th isolation word line 102; a (4n+3)th second switch 108 has a first terminal for receiving the first stress voltage VS1, a second terminal for receiving the second control voltage VC2, and a third terminal coupled to a (4n+3)th isolation word line 102; and a (4n+4)th second switch 108 has a first terminal for receiving the second stress voltage VS2, a second terminal for receiving the second control voltage VC2, and a third terminal coupled to a (4n+4)th isolation word line 102, where n is a positive integer or zero, $4n \leqq M-4$, and two active word lines 110 are formed between each two consecutive isolation word lines 102. In FIG. 1, the second switches 108 are P-type metal-oxide-semiconductor transistors. But, the second switches 108 can also be N-type metal-oxide-semiconductor transistors. In addition, as shown in FIG. 2, two active word lines 110 and the plurality of bit lines 104 are used for controlling a plurality of memory cells, where the M isolation word lines 102 are polysilicon isolation word lines or metal isolation word lines.

Because some leakage current paths are weak, some leakage current effects caused by the some leakage current paths may be very weak. Therefore, the memory device 100 first enters the burn in stress mode before performing a test on the memory device 100.

Figure 3:
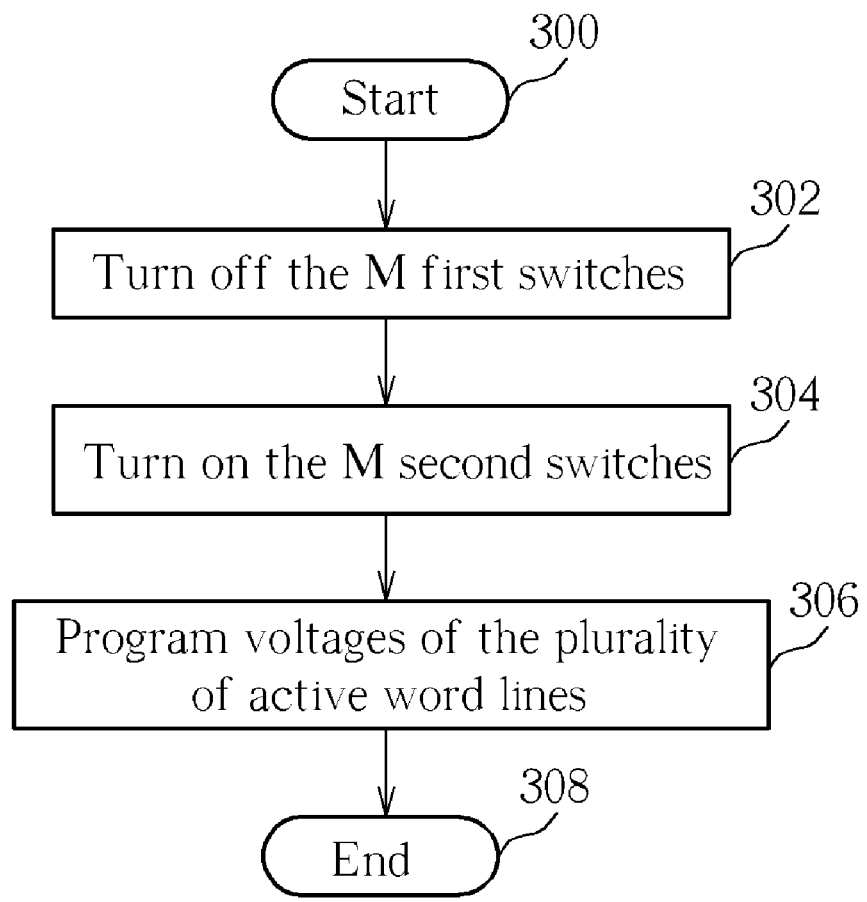
FIG. 3 is a flowchart illustrating a method for performing the burn in stress mode on the memory device according to another embodiment.

Please refer to FIG. 3. FIG. 3 is a flowchart illustrating a method for performing the burn in stress mode on the memory device 100 according to another embodiment. The method in FIG. 3 uses the memory device 100 in FIG. 1 for illustration. Detailed steps are as follows:

Step 300: Start.
Step 302: Turn off the M first switches 106.
Step 304: Turn on the M second switches 108.
Step 306: Program voltages of the plurality of active word lines 110.
Step 308: End.

In Steps 302, 304, because the M first switches 106 are turned off and the M second switches 108 are turned on, the (4n+1)th isolation word line 102 and the (4n+3)th isolation word line 102 receive the first stress voltage VS1, and the (4n+2)th isolation word line 102 and the (4n+4)th isolation word line 102 receive the second stress voltage VS2. The first stress voltage VS1 is different from the second stress voltage VS2. Therefore, even isolation word lines 102 and odd isolation word lines 102 are forced by different stress voltages (VS1, VS2), respectively. In Step 306, the voltages of the plurality of active word lines 110 are programmed, so voltages of two consecutive isolation word lines 102 and the two active word lines 110 formed between the two consecutive isolation word lines 102 are a logic-high voltage, a logic-low voltage, a logic-high voltage, and a logic-low voltage in turn. Thus, the burn in stress mode can strengthen any original weak leakage current path. The memory device 100 enters the burn in stress mode before the test is performed on the memory device 100, so the test can detect any original weak leakage current path more easily.

Figure 4:
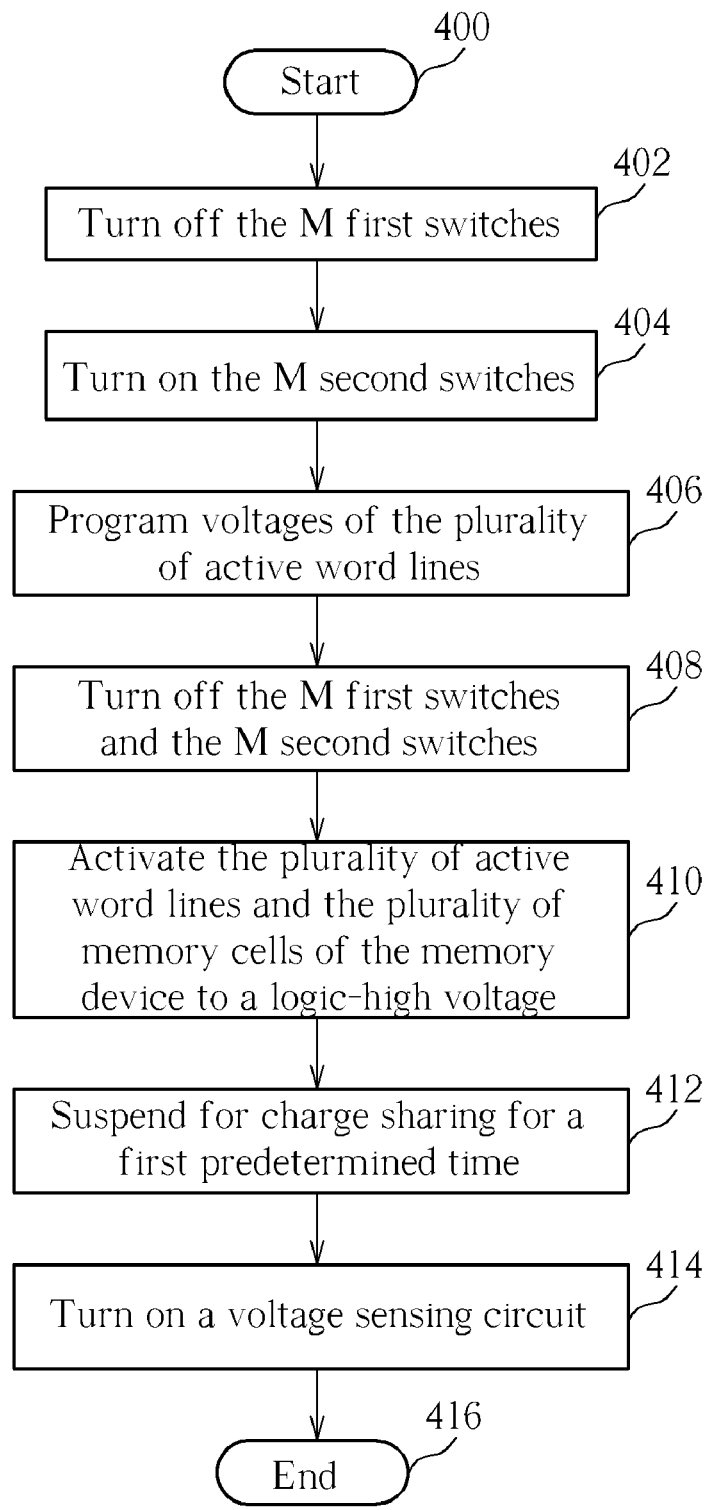
FIG. 4 is a flowchart illustrating a method for detecting leakage current of the memory device according to another embodiment.

Please refer to FIG. 4. FIG. 4 is a flowchart illustrating a method for detecting leakage current of the memory device 100 according to another embodiment. The method in FIG. 4 uses the memory device 100 in FIG. 1 for illustration. Detailed steps are as follows:

Step 400: Start.
Step 402: Turn off the M first switches 106.
Step 404: Turn on the M second switches 108.
Step 406: Program voltages of the plurality of active word lines 110.
Step 408: Turn off the M first switches 106 and the M second switches 108.
Step 410: Activate the plurality of active word lines 110 and the plurality of memory cells of the memory device 100 to a logic-high voltage Vpp.

Step 412: Suspend for charge sharing for a first predetermined time T1.

Step 414: Turn on a voltage sensing circuit.

Step 416: End.

Figure 5A:
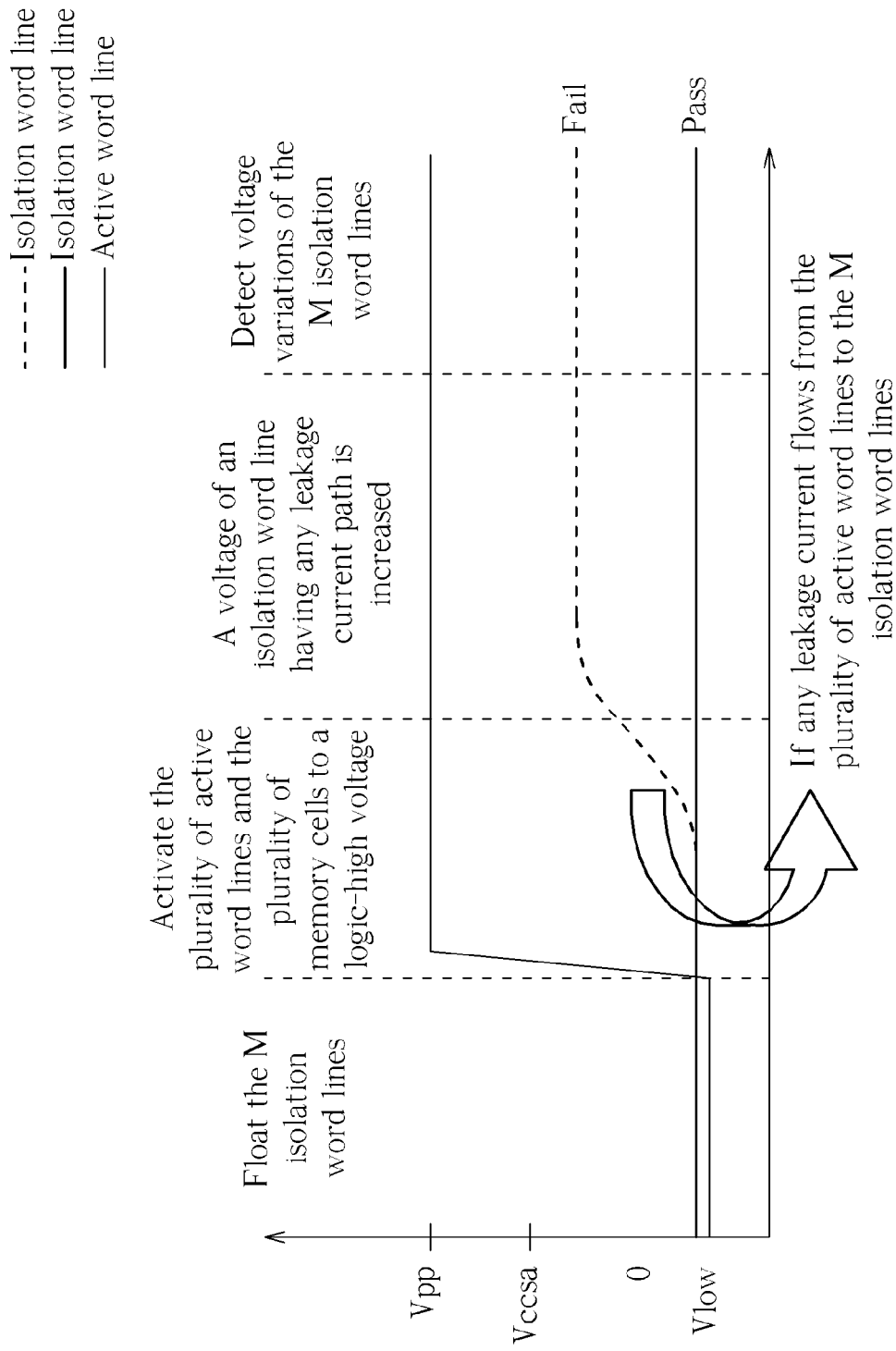
FIG. 5A is a timing diagram illustrating the method for detecting leakage current of the memory device in FIG. 4.
Figure 5B:
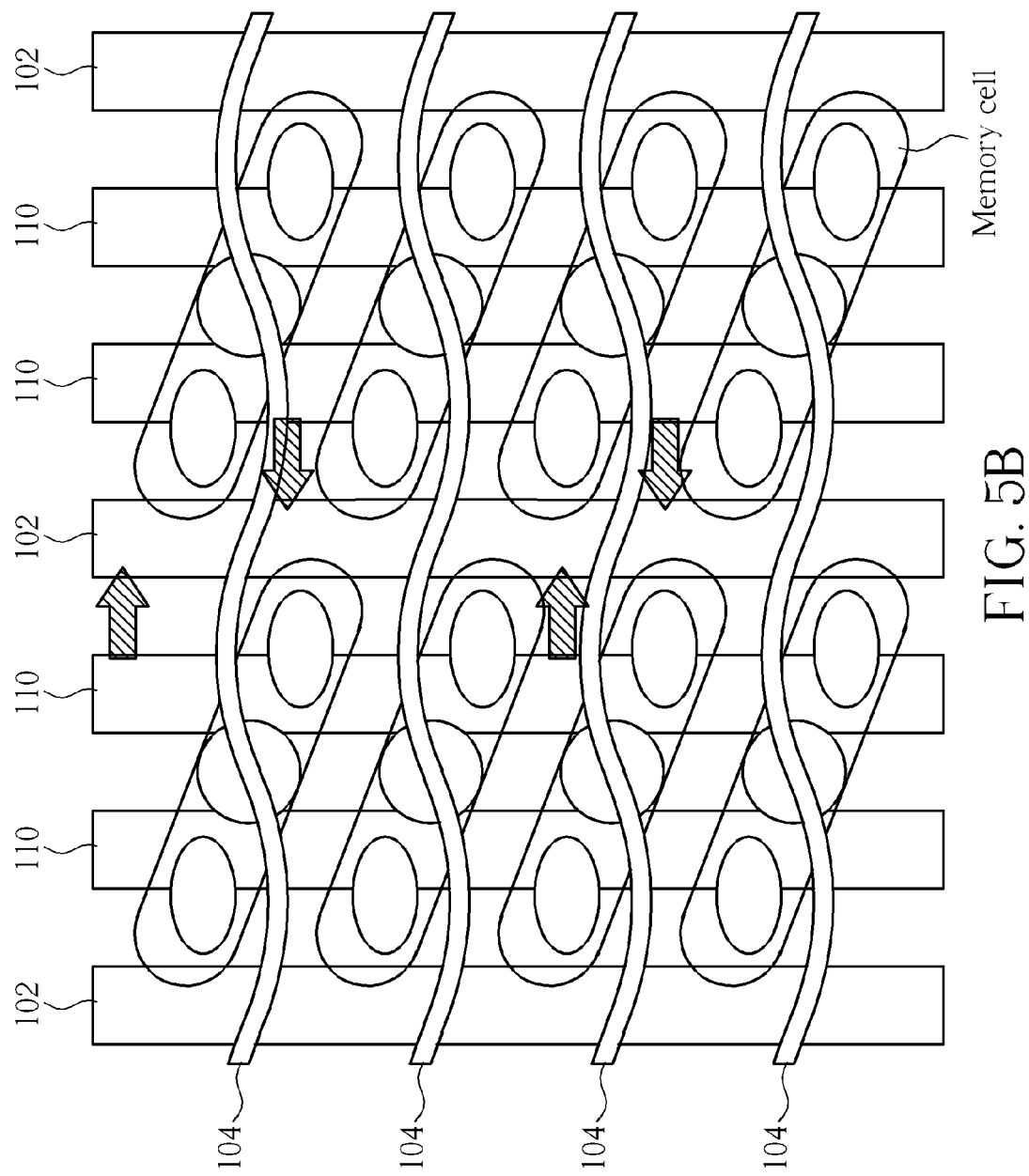
FIG. 5B is a diagram illustrating any leakage current path the method in FIG. 4 intending to detect.

The embodiment of FIG. 4 is used for detecting any leakage current path from an active word line 110 to an isolation word line 102. In Step 402-406, the memory device 100 enters the burn in stress mode to strengthen any original weak leakage current path. In Step 408, turning off the M first switches 106 and the M second switches 108 is used for floating the M isolation word lines 102. In Step 410, the plurality of active word lines 110 and the plurality of memory cells of the memory device 100 are activated to the logic-high voltage Vpp. Then, in Step 412, the memory device 100 is suspended for charge sharing for the first predetermined time T1. If any leakage current path exists between the plurality of active word lines 110 and the M isolation word lines 102, a voltage of an isolation word line 102 having any leakage current path is increased after charge sharing. Therefore, in Step 414, turning on the voltage sensing circuit to detect voltage variations of the M isolation word lines 102 can determine whether any leakage current path exists between the plurality of active word lines 110 and the M isolation word lines 102. Please refer to FIG. 5A and FIG. 5B. FIG. 5A is a timing diagram illustrating the method for detecting leakage current of the memory device 100 in FIG. 4, and FIG. 5B is a diagram illustrating any leakage current path the method in FIG. 4 intends to detect. As shown in FIG. 5A, if any leakage current path exists between the plurality of active word lines 110 and the M isolation word lines 102, the voltage sensing circuit can detect increase of the voltage of the isolation word line 102 having any leakage current path.

Figure 6:
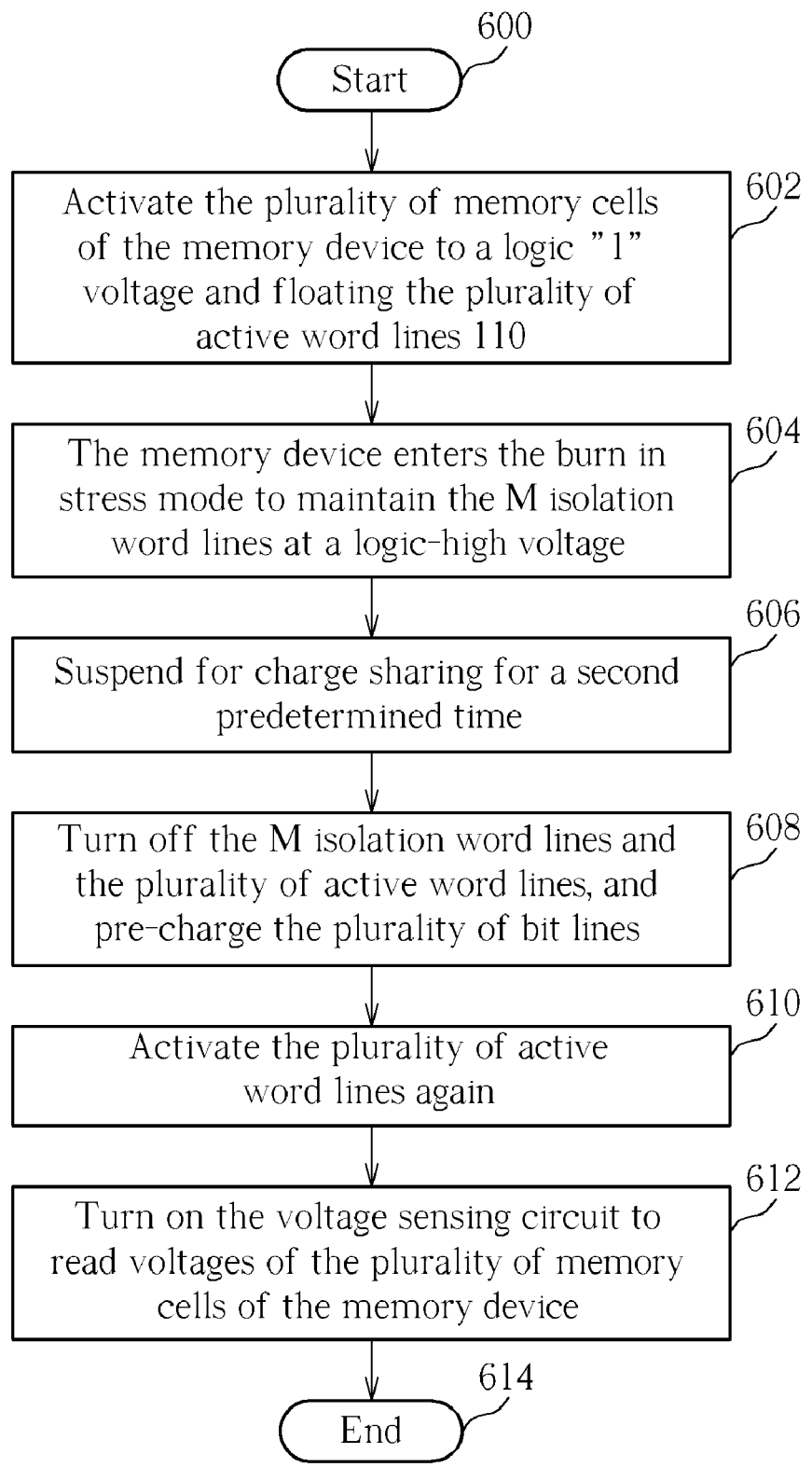
FIG. 6 is a flowchart illustrating a method for detecting leakage current of the memory device according to another embodiment.

Please refer to FIG. 6. FIG. 6 is a flowchart illustrating a method for detecting leakage current of the memory device 100 according to another embodiment. The method in FIG. 6 uses the memory device 100 in FIG. 1 for illustration. Detailed steps are as follows:

Step 600: Start.

Step 602: Activate the plurality of memory cells of the memory device 100 to a logic "1" voltage Vccsa and floating the plurality of active word lines 110 (Vlow).

Step 604: The memory device 100 enters the burn in stress mode to maintain the M isolation word lines 102 at a logic-high voltage Vpp.

Step 606: Suspend for charge sharing for a second predetermined time T2.

Step 608: Turn off the M isolation word lines 102 and the plurality of active word lines 110, and pre-charge the plurality of bit lines 104.

Step 610: Activate the plurality of active word lines 110 again.

Step 612: Turn on the voltage sensing circuit to read voltages of the plurality of memory cells of the memory device 100.

Step 614: End.

Figure 7A:
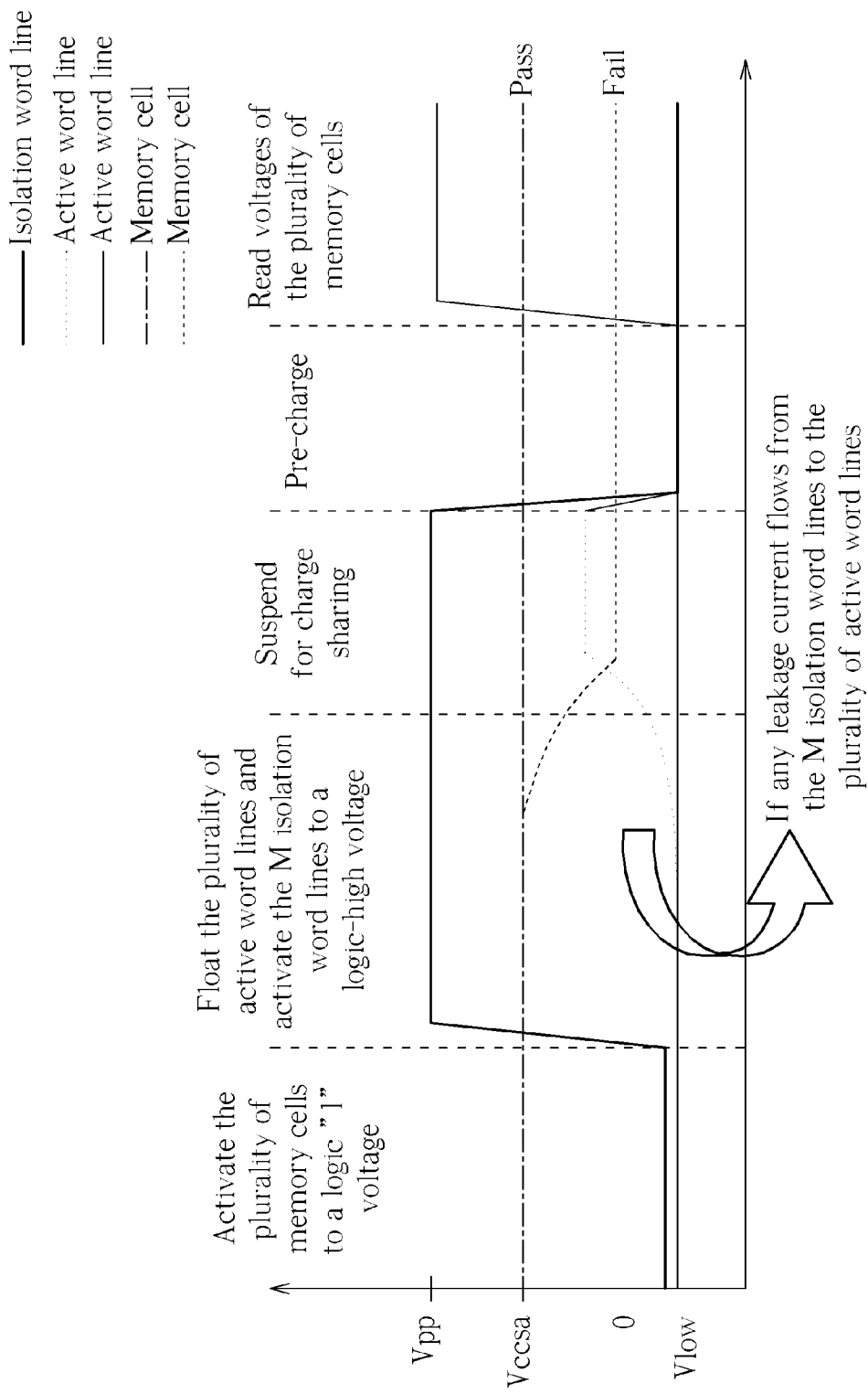
FIG. 7A is a timing diagram illustrating the method for detecting leakage current of the memory device in FIG. 6.
Figure 7B:
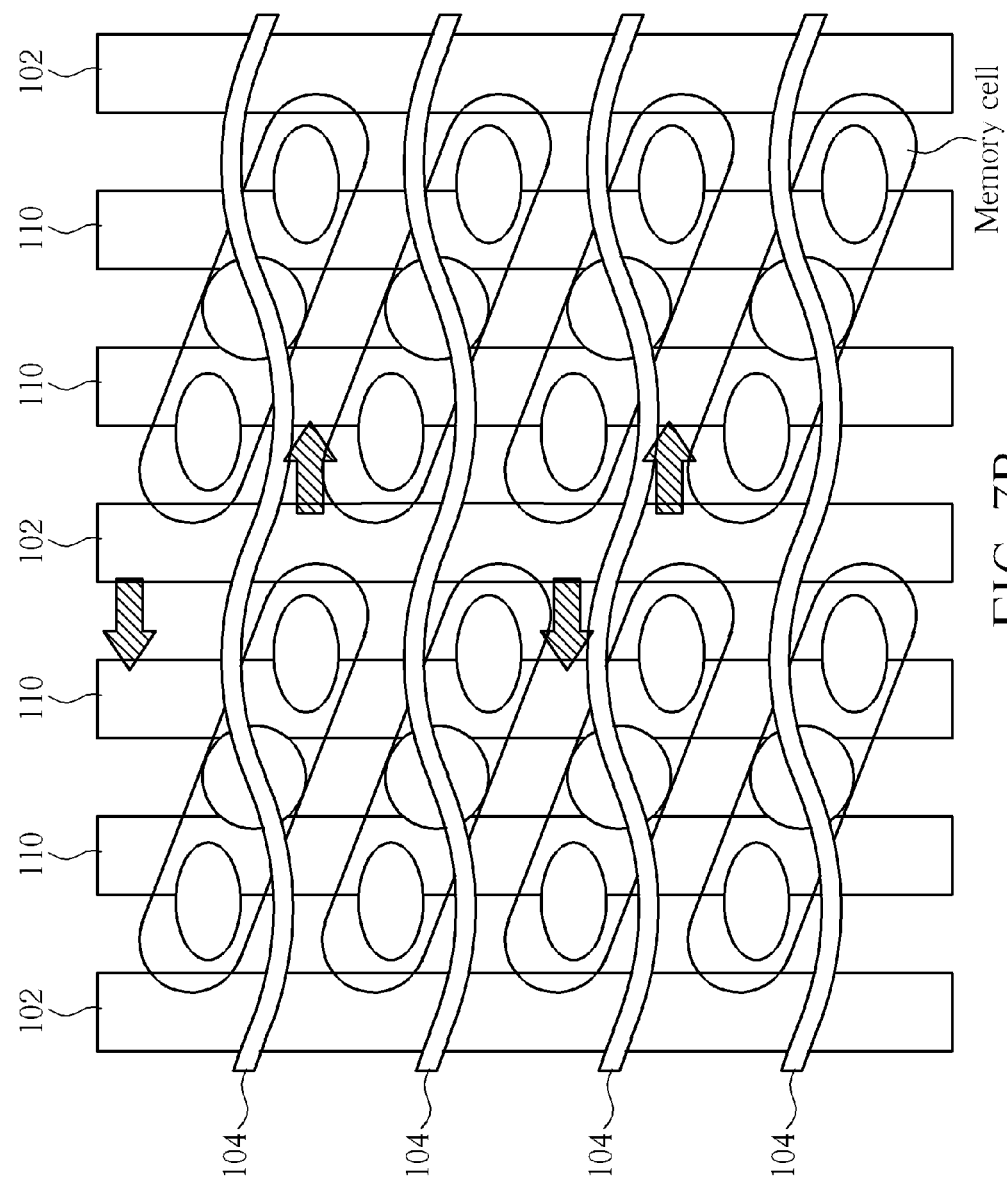
FIG. 7B is a diagram illustrating any leakage current path the method in FIG. 6 intending to detect.

The embodiment of FIG. 6 is used for detecting any leakage current path from an isolation word line 102 to an active word line 110. In Step 604, the memory device 100 enters the burn in stress mode to strengthen any original weak leakage current path and to maintain the M isolation word lines 102 at the logic-high voltage Vpp. In Step 606, if any leakage current path exists between the plurality of active word lines 110 and the M isolation word lines 102, because voltages of the plurality of floating active word lines 110 can be increased by the logic-high voltages Vpp of the M isolation word lines 102, the plurality of active word lines 110 can conduct. Therefore, the memory device 100 is suspended for charge sharing between the plurality of bit lines 104 (voltage ½ Vccsa) and the plurality of memory cells (voltage Vccsa) for the second predetermined time T2. After charge sharing between the plurality of bit lines 104 and the plurality of memory cells, voltages of the plurality of memory cells are lower than the voltage Vccsa due to charge sharing. In Step 608, the plurality of bit lines 104 are pre-charged to erase influence of leakage currents, but the voltages of the plurality of memory cells are still maintained at voltages after charge sharing. In Step 612, the voltage sensing circuit is turned on to read the voltages of the plurality of memory cells of the memory device 100 to determine whether any leakage current path exists between the plurality of active word lines 110 and the M isolation word lines 102. Please refer to FIG. 7A and FIG. 7B. FIG. 7A is a timing diagram illustrating the method for detecting leakage current of the memory device 100 in FIG. 6, and FIG. 7B is a diagram illustrating any leakage current path the method in FIG. 6 intends to detect. As shown in FIG. 7A, if any leakage current flows from the M isolation word lines 102 to the plurality of active word lines 110, the voltage sensing circuit can detect that voltages of some memory cells are lower than the voltage Vccsa.

Figure 8:
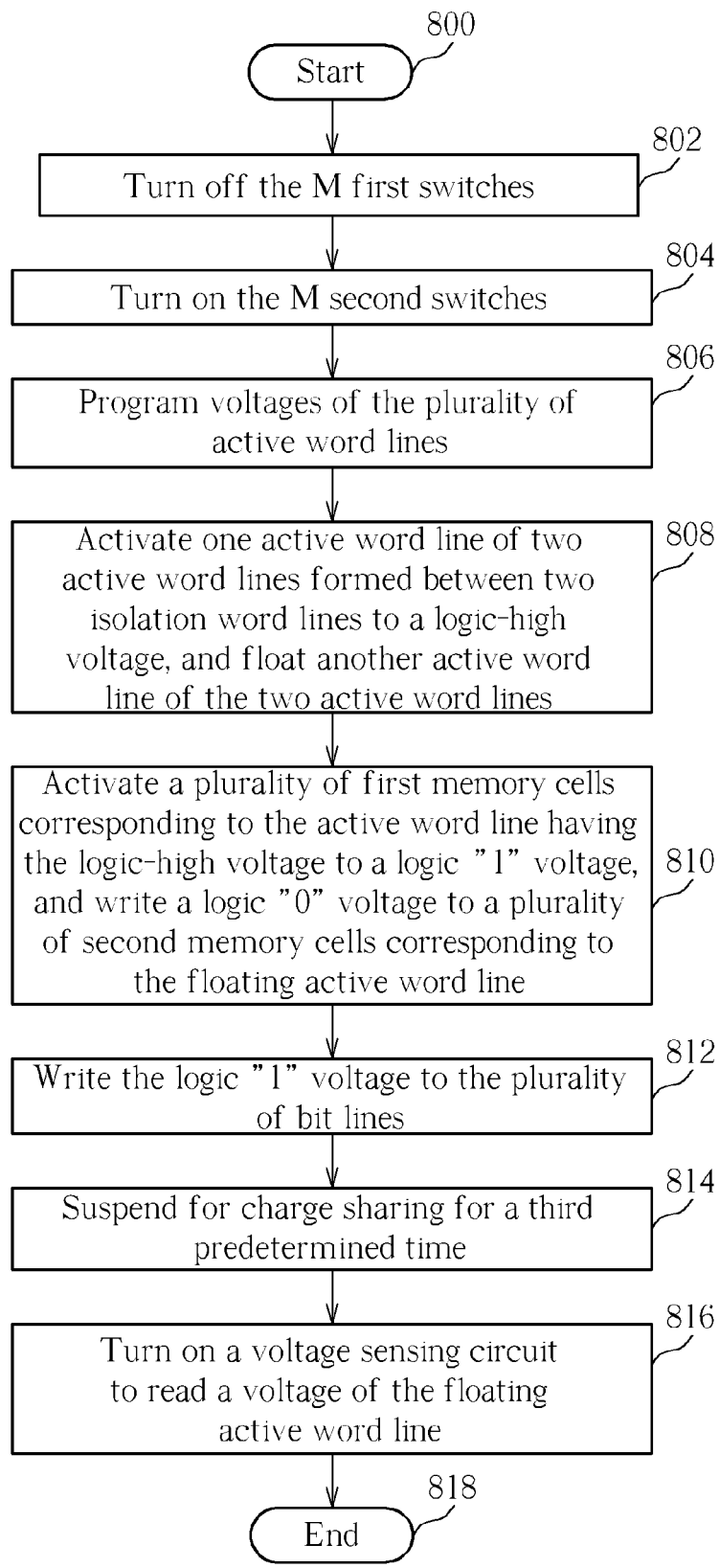
FIG. 8 is a flowchart illustrating a method for detecting leakage current of the memory device according to another embodiment.

Please refer to FIG. 8. FIG. 8 is a flowchart illustrating a method for detecting leakage current of the memory device 100 according to another embodiment. The method in FIG. 8 uses the memory device 100 in FIG. 1 for illustration. Detailed steps are as follows:

Step 800: Start.

Step 802: Turn off the M first switches 106.

Step 804: Turn on the M second switches 108.

Step 806: Program voltages of the plurality of active word lines 110.

Step 808: Activate one active word line 110 of two active word lines 110 formed between two isolation word lines 102 to a logic-high voltage Vpp, and float another active word line 110 of the two active word lines 110.

Step 810: Activate a plurality of first memory cells corresponding to the active word line 110 having the logic-high voltage Vpp to a logic "1" voltage Vccsa, and write a logic "0" voltage to a plurality of second memory cells corresponding to the floating active word line 110.

Step 812: Write the logic "1" voltage Vccsa to the plurality of bit lines 104.

Step 814: Suspend for charge sharing for a third predetermined time T3.

Step 816: Turn on a voltage sensing circuit to read a voltage of the floating active word line 110.

Step 818: End.

Figure 9:
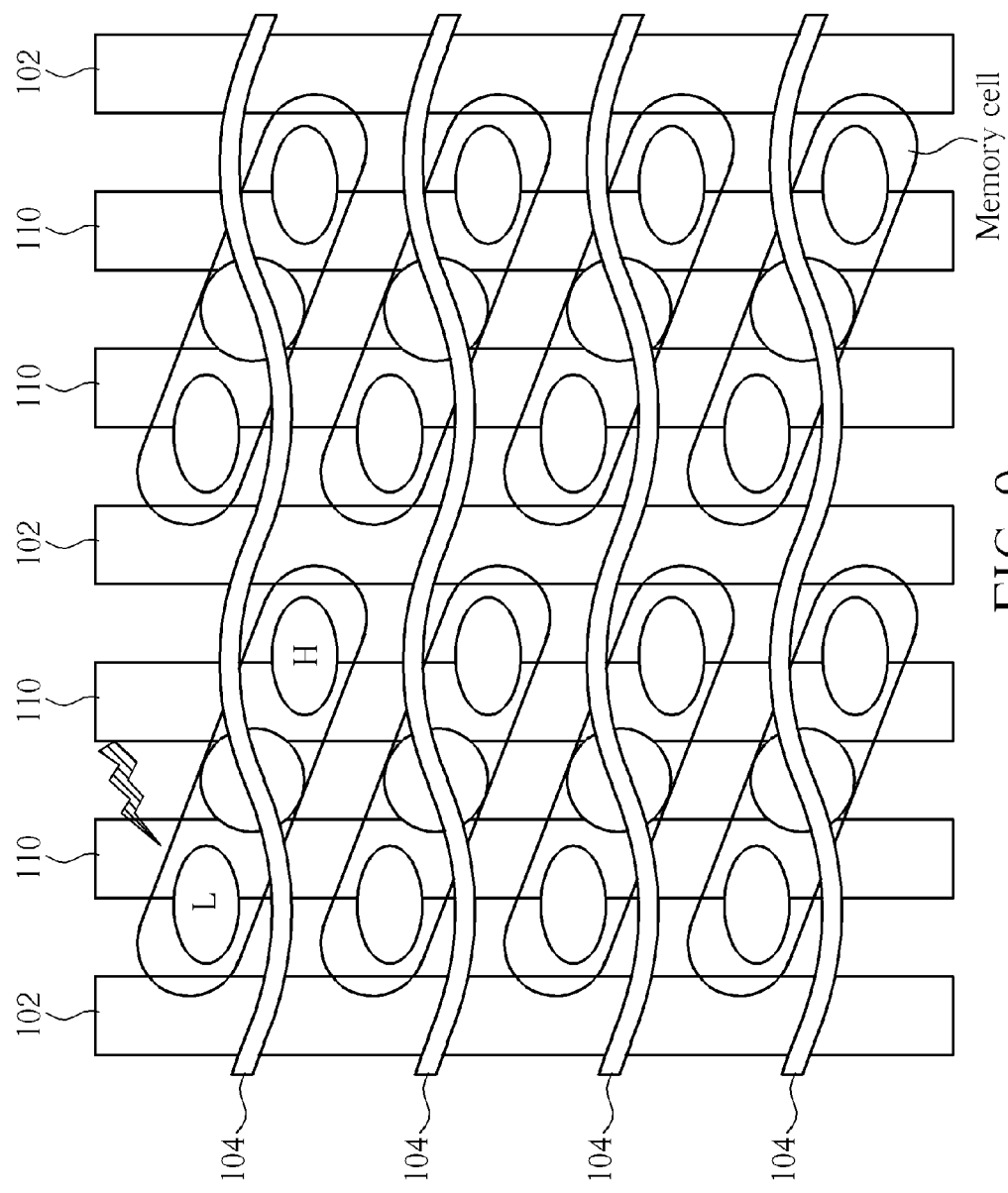
FIG. 9 is a diagram illustrating any leakage current path the method in FIG. 8 intending to detect.
Figure 10A:
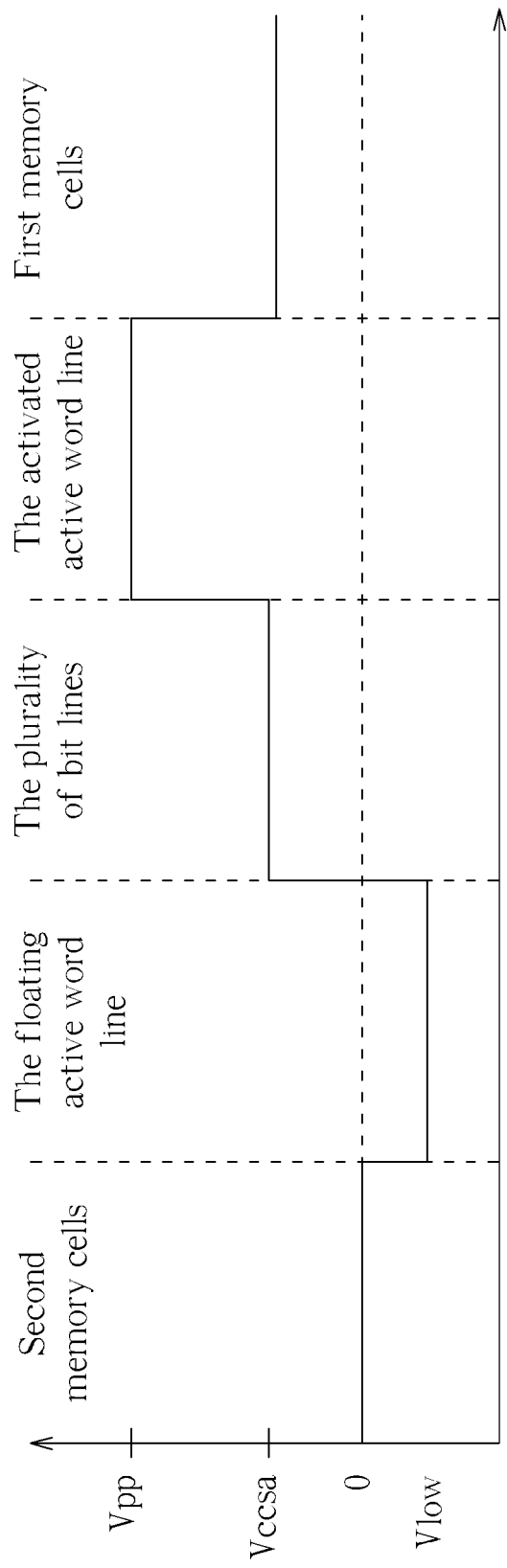
FIG. 10A is a diagram illustrating the voltage of the floating active word line, a voltage of the active word line having the logic-high voltage, voltages of the plurality of first memory cells, voltages of the plurality of second memory cells, and voltages of the plurality of bit lines before charge sharing.
Figure 10B:
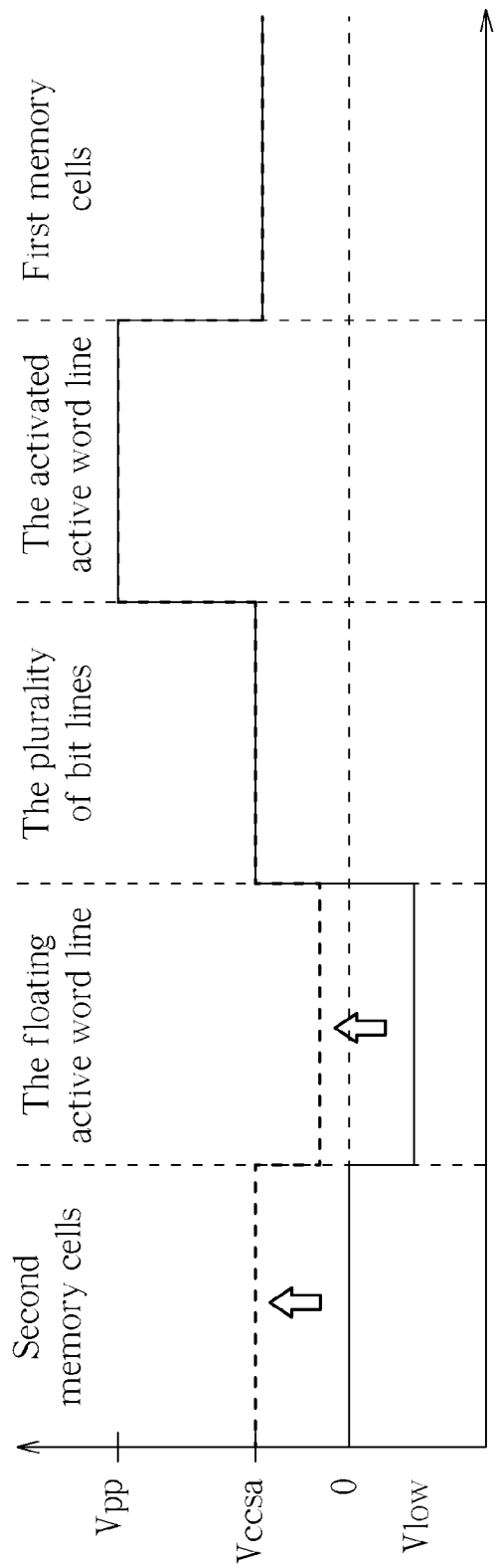
FIG. 10B is a diagram illustrating the voltage of the floating active word line, the voltage of the active word line having the logic-high voltage, the voltages of the plurality of first memory cells, the voltages of the plurality of second memory cells, and the voltages of the plurality of bit lines after charge sharing.

The embodiment of FIG. 8 is used for detecting any leakage current path between two adjacent active word lines 110. In Step 802-806, the memory device 100 first enters the burn in stress mode to strengthen any original weak leakage current path. If any leakage current path exists between the floating active word line 110 and the active word line 110 having the logic-high voltage Vpp, in Step 814, the active word line 110 having the logic-high voltage Vpp and the plurality of first memory cells having the logic "1" voltage Vccsa can share charges with the floating active word line 110 having a logic-low voltage Vlow and the plurality of second memory cells having the logic "0" voltage through the plurality of bit lines 104 having the logic "1" voltage Vccsa. Therefore, the memory device 100 is suspended for charge sharing for the third predetermined time T3. In Step 816, the voltage sensing circuit is turned on to read the voltage of the floating active word line 110. If any leakage current path exists between the floating active word line 110 and the active word line 110 having the logic-high voltage Vpp, the voltage sensing circuit can determine that the voltage of the floating active word line 110 is higher than the logic-low voltage Vlow, and voltages of the plurality of second memory cells corresponding to the floating active word line 110 are higher than the logic "0" voltage. Please refer to FIG. 9, FIG. 10A, and FIG. 10B. FIG. 9 is a diagram illustrating any leakage current path the method in FIG. 8 intends to detect, FIG. 10A is a diagram illustrating the voltage of the floating active word line 110, a voltage of the active word line 110 having the logic-high voltage Vpp, voltages of the plurality of first memory cells, voltages of the plurality of second memory cells, and voltages of the plurality of bit lines 104 before charge sharing, and FIG. 10B is a diagram illustrating the voltage of the floating active word line 110, the voltage of the active word line 110 having the logic-high voltage Vpp, the voltages of the plurality of first memory cells, the voltages of the plurality of second memory cells, and the voltages of the plurality of bit lines 104 after charge sharing.

The embodiments of FIG. 4 and FIG. 6 are only suitable for $6F^2$, $86F^2$ dynamic random access memories, but the embodiments of FIG. 8 can be applied to any dynamic random access memory. In addition, if the memory device 100 is the $6F^2$ dynamic random access memory or the $8F^2$ dynamic random access memory, the embodiments of FIG. 4 and FIG. 6 can be utilized to detect any leakage current path of the memory device 100 following Step 818.

To sum up, the memory device capable of operation in the burn in stress mode, the method for performing the burn in stress mode on the memory device, and the method for detecting leakage current of the memory device first let the memory device enter the burn in stress mode for strengthening any original weak leakage current path. Then, the memory device including the isolation word lines can be used for detecting any leakage current path from the active word lines to the isolation word lines, any leakage current path from the isolation word lines to the active word lines, and any leakage current path between two adjacent active word lines. Therefore, compared to the prior art, the present invention can detect all leakage current paths corresponding to a plurality of word lines of the memory device by an isolation word line design and the burn in stress mode.

Those skilled in the art will readily observe that numerous modifications and alterations of the device and method may be made while retaining the teachings of the invention.

What is claimed is:

1. A memory device capable of operation in a burn in stress mode, the memory device comprising:
    M isolation word lines, wherein M is a positive integer multiple of 4;
    a plurality of active word lines;
    a plurality of bit lines;
    M first switches, wherein each first switch has a first terminal for receiving a low voltage, a second terminal for receiving a first control voltage, and a third terminal coupled to an isolation word line; and
    M second switches, wherein a (4n+1)th second switch has a first terminal for receiving a first stress voltage, a second terminal for receiving a second control voltage, and a third terminal coupled to a (4n+1)th isolation word line; a (4n+2)th second switch has a first terminal for receiving a second stress voltage, a second terminal for receiving the second control voltage, and a third terminal coupled to a (4n+2)th isolation word line; a (4n+3)th second switch has a first terminal for receiving the first stress voltage, a second terminal for receiving the second control voltage, and a third terminal coupled to a (4n+3)th isolation word line; and, a (4n+4)th second switch has a first terminal for receiving the second stress voltage, a second terminal for receiving the second control voltage, and a third terminal coupled to a (4n+4)th isolation word line;
    wherein n is a positive integer or zero, $4n \leq M-4$, and two active word lines are formed between each two consecutive isolation word lines, wherein the two active word lines and the plurality of bit lines are used for controlling a plurality of memory cells.

2. The memory device of claim 1, wherein the M isolation word lines are polysilicon isolation word lines.

3. The memory device of claim 1, wherein the M isolation word lines are metal isolation word lines.

4. The memory device of claim 1, wherein the M first switches are N-type metal-oxide-semiconductor transistors.

5. The memory device of claim 1, wherein the M first switches are P-type metal-oxide-semiconductor transistors.

6. The memory device of claim 1, wherein the M second switches are N-type metal-oxide-semiconductor transistors.

7. The memory device of claim 1, wherein the M second switches are P-type metal-oxide-semiconductor transistors.

8. A method of performing the burn in stress mode on the memory device of claim 1, the method comprising:
    turning off the M first switches;
    turning on the M second switches for the (4n+1)th isolation word line and the (4n+3)th isolation word line to receive the first stress voltage, and the (4n+2)th isolation word line and the (4n+4)th isolation word line to receive the second stress voltage, wherein the first stress voltage is different from the second stress voltage; and
    programming voltages of the plurality of active word lines.

9. A method for detecting leakage current of the memory device of claim 1, the method comprising:
    turning off the M first switches and the M second switches;
    activating the plurality of active word lines and the plurality of memory cells of the memory device to a logic-high voltage;
    suspending for charge sharing for a first predetermined time; and
    turning on a voltage sensing circuit to determine whether at least one leakage current path exists between the plurality of active word lines and the M isolation word lines.

10. The method of claim 9, further comprising:
    turning off the M first switches and turning on the M second switches before the M first switches and the M second switches are turned off for the (4n+1)th isolation word line and the (4n+3)th isolation word line to receive the first stress voltage, and the (4n+2)th isolation word line and the (4n+4)th isolation word line to receive the second stress voltage, wherein the first stress voltage is different from the second stress voltage; and
    programming voltages of the plurality of active word lines.

11. A method for detecting leakage current of the memory device of claim 1, the method comprising:
    activating the plurality of memory cells to a logic "1" voltage, and floating the plurality of active word lines;
    entering the burn in stress mode to maintain the M isolation word lines at a logic-high voltage;
    suspending for charge sharing for a second predetermined time;
    turning off the M isolation word lines and the plurality of active word lines and pre-charging the plurality of bit lines;
    activating the plurality of active word lines again; and reading voltages of the plurality of memory cells to determine whether at least one leakage current path exists between the plurality of active word lines and the M isolation word lines.

12. The method of claim 11, wherein entering the burn in stress mode comprises:
  turning off the M first switches;
  turning on the M second switches for the (4n+1)th isolation word line and the (4n+3)th isolation word line to receive the first stress voltage, and the (4n+2)th isolation word line and the (4n+4)th isolation word line to receive the second stress voltage, wherein the first stress voltage is different from the second stress voltage; and
  programming voltages of the plurality of active word lines.

13. A method for detecting leakage current of the memory device of claim 1, the method comprising:
  activating one active word line of two active word lines formed between two isolation word lines to a logic-high voltage, and floating another active word line of the two active word lines;
  activating a plurality of first memory cells corresponding to the active word line having the logic-high voltage to a logic "1" voltage, and writing a logic "0" voltage to a plurality of second memory cells corresponding to the floating active word line;
  writing the logic "1" voltage to the plurality of bit lines;
  suspending for charge sharing for a third predetermined time; and
  reading voltages of the floating active word line to determine whether at least one leakage current path exists between the floating active word line and the active word line having the logic-high voltage.

14. The method of claim 13, further comprising:
  activating the plurality of first memory cells and the plurality of second memory cells to the logic "1" voltage, and floating the plurality of active word lines;
  entering the burn in stress mode to maintain the M isolation word lines at the logic-high voltage;
  suspending for charge sharing for a second predetermined time;
  turning off the M isolation word lines and the plurality of active word lines;
  activating the plurality of active word lines again; and
  reading voltages of the plurality of first memory cells and the plurality of second memory cells to determine whether at least one leakage current path exists between the plurality of active word lines and the M isolation word lines.

15. The method of claim 13, wherein before activating the active word line of the two active word lines formed between the two isolation word lines to the logic-high voltage, and floating another active word line of the two active word lines, the method further comprises entering the burn in stress mode, and entering the burn in stress mode comprises:
  turning off the M first switches;
  turning on the M second switches for the (4n+1)th isolation word line and the (4n+3)th isolation word line to receive the first stress voltage, and the (4n+2)th isolation word line and the (4n+4)th isolation word line to receive the second stress voltage, wherein the first stress voltage is different from the second stress voltage; and
  programming voltages of the plurality of active word lines.

16. The method of claim 15, further comprising:
  activating the plurality of first memory cells and the plurality of second memory cells to the logic "1" voltage, and floating the plurality of active word lines;
  entering the burn in stress mode to maintain the M isolation word lines at the logic-high voltage;
  suspending for charge sharing for a second predetermined time;
  turning off the M isolation word lines and the plurality of active word lines;
  activating the plurality of active word lines again; and
  reading voltages of the plurality of first memory cells and the plurality of second memory cells to determine whether at least one leakage current path exists between the plurality of active word lines and the M isolation word lines.

17. The method of claim 13, further comprising:
  turning off the M first switches and the M second switches;
  activating the plurality of active word lines and the plurality of memory cells to the logic-high voltage;
  suspending for charge sharing for the first predetermined time; and
  turning on a voltage sensing circuit to determine whether at least one leakage current path exists between the plurality of active word lines and the M isolation word lines.

18. The method of claim 17, further comprising:
  activating the plurality of first memory cells and the plurality of second memory cells to the logic "1" voltage, and floating the plurality of active word lines;
  entering the burn in stress mode to maintain the M isolation word lines at the logic-high voltage;
  suspending for charge sharing for a second predetermined time;
  turning off the M isolation word lines and the plurality of active word lines;
  activating the plurality of active word lines again; and
  reading voltages of the plurality of first memory cells and the plurality of second memory cells to determine whether at least one leakage current path exists between the plurality of active word lines and the M isolation word lines.

* * * * *